United States Patent
Liu et al.

(10) Patent No.: US 9,515,259 B2
(45) Date of Patent: Dec. 6, 2016

(54) PHASE CHANGE MEMORY

(71) Applicants: Tsinghua University, Beijing (CN); HON HAI PRECISION INDUSTRY CO., LTD., New Taipei (TW)

(72) Inventors: Peng Liu, Beijing (CN); Yang Wu, Beijing (CN); Qun-Qing Li, Beijing (CN); Kai-Li Jiang, Beijing (CN); Jia-Ping Wang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 156 days.

(21) Appl. No.: 14/583,797

(22) Filed: Dec. 29, 2014

(65) Prior Publication Data

US 2016/0248005 A1    Aug. 25, 2016

(30) Foreign Application Priority Data

Jan. 15, 2014    (CN) .......................... 2014 1 0016740

(51) Int. Cl.
| G11C 11/00 | (2006.01) |
| H01L 45/00 | (2006.01) |
| G11C 13/00 | (2006.01) |
| H01L 27/24 | (2006.01) |

(52) U.S. Cl.
CPC ........... *H01L 45/126* (2013.01); *G11C 13/004* (2013.01); *G11C 13/0004* (2013.01); *G11C 13/0069* (2013.01); *G11C 13/0097* (2013.01); *H01L 27/2463* (2013.01); *H01L 45/065* (2013.01); *H01L 45/144* (2013.01)

(58) Field of Classification Search
CPC . H01L 45/126; H01L 45/065; H01L 45/144; H01L 27/2463; G11C 13/0069; G11C 13/0097; G11C 13/0004; G11C 13/004
See application file for complete search history.

(56) References Cited

U.S. PATENT DOCUMENTS

2007/0138525 A1*    6/2007    Jang ....................... B82Y 10/00
                                                            257/296

* cited by examiner

*Primary Examiner* — Pho M Luu
*Assistant Examiner* — Mohammed A Bashar
(74) *Attorney, Agent, or Firm* — Zhigang Ma

(57) ABSTRACT

A phase change memory includes a substrate, a number of row electrode leads located on the substrate, and a number of column electrode leads located on the substrate and intersected with the number of row electrode leads to define a number of sections. A number of phase change memory units is received in the number of sections and includes a first circuit and a second circuit. The first circuit includes a carbon nanotube wire electrically connected between the first row electrode lead and first column electrode lead, the carbon nanotube wire includes a bending portion. The second circuit includes the first row electrode lead, the carbon nanotube wire, a phase change layer, and the second row electrode lead electrically connected in series, wherein the phase change layer is electrically connected between the bending portion of the carbon nanotube wire and the second row electrode.

17 Claims, 11 Drawing Sheets

PHASE CHANGE MEMORY

CROSS-REFERENCE TO RELATED APPLICATIONS

This application claims all benefits accruing under 35 U.S.C. §119 from China Patent Application 201410016740.4, filed on Jan. 15, 2014 in the China Intellectual Property Office, disclosure of which is incorporated herein by reference.

BACKGROUND

1. Technical Field

The present disclosure relates to a phase change memory cell, a phase change memory, and a method of making the same.

2. Description of Related Art

Generally, semiconductor memory devices are categorized as random access memories (RAMs) or read-only memories (ROMs). ROMs are nonvolatile memory devices such as PROMs (programmable ROMs), EPROMs (erasable PROMs), EEPROMs (electrical EPROMs), and flash memory devices, which retain their stored data even when their power supplies are interrupted. New types of RAMs containing nonvolatile memory devices have recently been introduced. Examples includes ferroelectric RAMs (FRAMs) employing ferroelectric capacitors, magnetic RAMs (MRAMs) employing tunneling magneto-resistive (TMR) films, and phase change memories (PCM) using chalcogenide alloys. Among these, the phase change memory cannot only be widely used in civilian areas of microelectronics such as mobile phones, digital cameras, MP3 players, and mobile memory, but also has important applications in aerospace, missile systems, and military field in the future. The phase change memory devices are relatively easy to fabricate, and thus phase change memory devices may provide the best opportunities in the actual implementation of high-capacity, low cost nonvolatile RAMs.

In traditional phase change memory cell, a heating element is used to heat the phase change material. During the dynamic storage, the heating element heats the phase change material to produce phase transition. However, one problem is that the heating element is made of metal or semiconductor, so it is prone to damage or oxidation during the cycle of heating process. Thus the lifespan of phase change memory cell will be affected. Furthermore, the heating element is formed by sputtering or vapor deposition, this process is complex and the production cost is relatively high.

What is needed, therefore, is to provide a phase change memory cell and a phase change memory that can overcome the above-described shortcomings.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
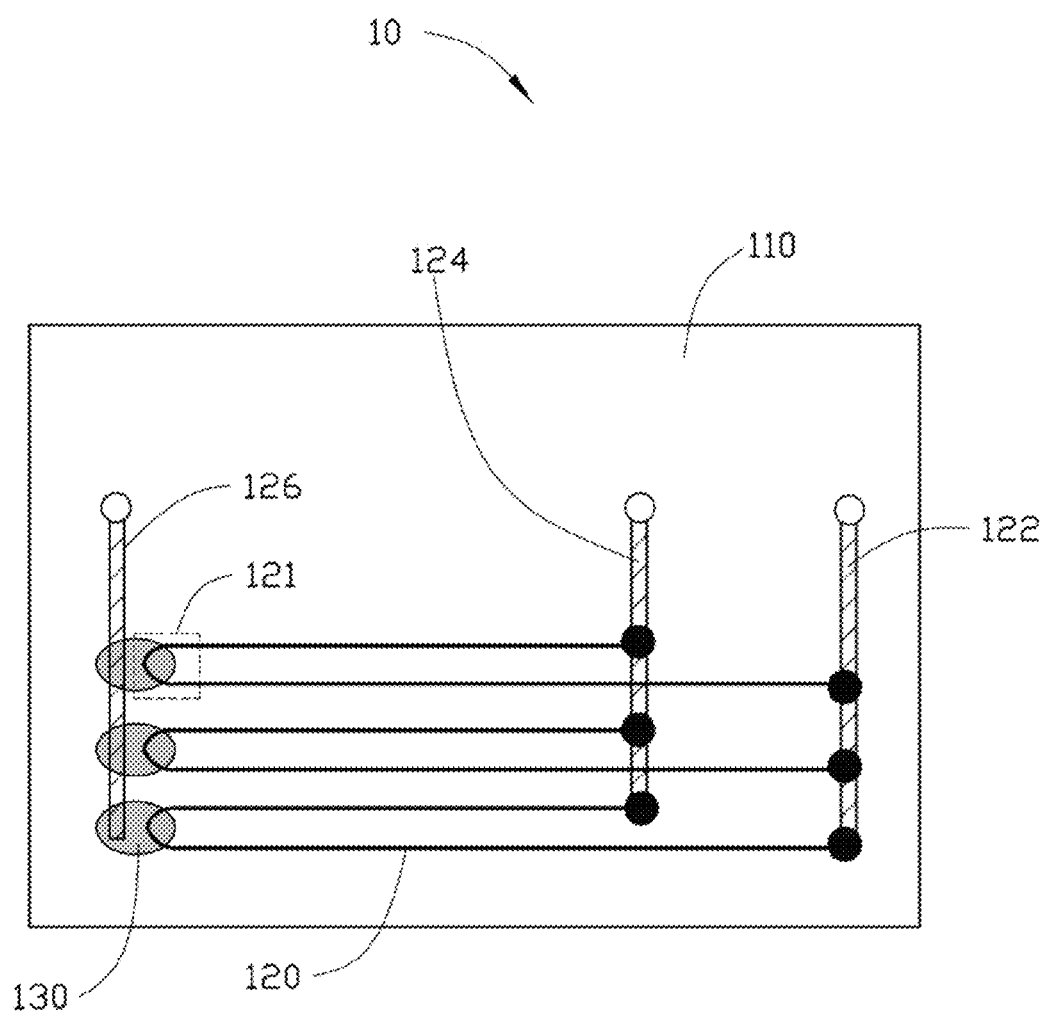
FIG. 1 shows a schematic top view of one embodiment of a phase change memory cell.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

A phase change memory cell includes a substrate, a carbon nanotube layer, a phase change layer, a first electrode, a second electrode, and a third electrode. The substrate is used to support the carbon nanotube layer, the phase change layer, the first electrode, the second electrode, and the third electrode. The carbon nanotube layer includes a carbon nanotube wire. The carbon nanotube wire includes a bending portion spaced from the third electrode. The phase change layer is located between and electrically connected with the third electrode and the bending portion. The phase change layer covers at least a part of the bending portion. The carbon nanotube wire includes a first end and a second end. The first end is electrically connected to the first electrode, and the second end is electrically connected to the second end.

The phase change memory cell includes a writing circuit and a reading circuit. The writing circuit includes the first electrode, the carbon nanotube wire, and the second electrode electrically connected in series. The writing circuit is used to write data into the phase change memory cell. The reading circuit includes the third electrode, the phase change layer, and the first electrode or the second electrode electrically connected in series. The reading circuit is used to read data from the phase change memory cell. Both the writing circuit and the reading circuit can be used to reset the phase change memory cell.

The substrate is an insulating substrate, and the material of the substrate can be porcelain, glass, resin, quartz, or any combination thereof. The substrate has a character of high temperature endurance, thus the shape of the substrate can be retained during the working process of the phase change memory cell. The size and the thickness of the substrate can be selected according to the working temperature of the phase change memory cell. In one embodiment, the substrate is flexible, and the material of the substrate can be selected form polyimide, phenolic resin, polyester resin, and polyamide resin. In one embodiment, the material of the substrate is polyimide with a thickness of about 20 μm. The shape of the substrate can be retained under a temperature of 400° C.

The carbon nanotube wire is a continuous wire. The carbon nanotube wire can be a single carbon nanotube. The carbon nanotube wire comprises a first portion, a second portion, and the bending portion based on their function. The first portion, the bending portion, and the second portion are connected in series to form the continuous carbon nanotube wire. The bending portion is located between the first portion and the second portion. The first portion is spaced from the second portion.

The bending portion can be in a shape of a curve structure or a folded structure. A bending angle θ of the bending portion ranges from about 0 degree to about 180 degrees, such as 90 degrees. In one embodiment, the bending angle θ ranges from about 30 degrees to about 60 degrees. Furthermore, the carbon nanotube wire can be folded, thus the first portion can be parallel with the second portion of the carbon nanotube wire, and the bending portion forms the folded structure.

Because the carbon nanotube wire is bent or folded, the carbon nanotubes at the bending portion will be affected, and defects will be formed in some of the carbon nanotubes. Thus the resistance of these carbon nanotubes at the bending portion will be increased. The smaller the bending angle, the greater the resistance of the carbon nanotube wire at the bending portion. Thus more heat can be accumulated per unit time.

Furthermore, the bending portion can also be formed by winding the carbon nanotube wire around some object. Thus the bending portion of the carbon nanotube wire can form a circular structure or a spiral structure. The circular structure can be rectangular, circular, or triangular. Thus the heat efficiency can be further improved. An inner diameter of the bending portion can range from about 100 nanometers to about 10 micrometers.

The first portion is spaced from the second portion of the carbon nanotube wire. In one embodiment, the first portion is parallel with the second portion, and a distance between the first portion and the second portion ranges from about 1 micrometers to about 10 micrometers. The first portion is insulated from the second portion, except electrically connected with each other via the bending portion of the carbon nanotube wire. Furthermore, the first portion and the second portion of the carbon nanotube wire can be coated with a metal layer (not shown) to increase the conductivity.

The carbon nanotube wire includes untwisted carbon nanotube wire and twisted carbon nanotube wire. The untwisted carbon nanotube wire includes a plurality of carbon nanotubes substantially oriented along a same direction (i.e., a direction along the length of the untwisted carbon nanotube wire). The carbon nanotubes are parallel to the axis of the untwisted carbon nanotube wire. Specifically, the untwisted carbon nanotube wire includes a plurality of successive carbon nanotube segments joined end to end by van der Waals attractive force therebetween. Each carbon nanotube segment includes a plurality of carbon nanotubes substantially parallel to each other, and combined by van der Waals attractive force therebetween. The carbon nanotube segments can vary in width, thickness, uniformity, and shape. Length of the untwisted carbon nanotube wire can be arbitrarily set as desired. A diameter of the untwisted carbon nanotube wire ranges from about 0.5 nm to about 100 μm.

The twisted carbon nanotube wire can be formed by twisting a drawn carbon nanotube film using a mechanical force to turn the two ends of the drawn carbon nanotube film in opposite directions. The twisted carbon nanotube wire includes a plurality of carbon nanotubes helically oriented around an axial direction of the twisted carbon nanotube wire. Specifically, the twisted carbon nanotube wire includes a plurality of successive carbon nanotube segments joined end to end by van der Waals attractive force therebetween. Each carbon nanotube segment includes a plurality of carbon nanotubes parallel to each other, and combined by van der Waals attractive force therebetween. Length of the carbon nanotube wire can be set as desired. A diameter of the twisted carbon nanotube wire can be from about 0.5 nm to about 100 μm. Further, the twisted carbon nanotube wire can be treated with a volatile organic solvent after being twisted. After being soaked by the organic solvent, the adjacent paralleled carbon nanotubes in the twisted carbon nanotube wire will bundle together, due to the surface tension of the organic solvent when the organic solvent volatilizes. The specific surface area of the twisted carbon nanotube wire will decrease, while the density and strength of the twisted carbon nanotube wire will be increased.

The first electrode and the second electrode are electrically connected to the first portion and the second portion respectively. The first electrode and the second electrode are used to supply voltage to the phase change memory cell. The material of the first electrode and the second electrode can be made of conductive material such as conductive pastes, metal or ITO. The thickness of the first electrode and the second electrode can range from about 10 nm to about 100 μm respectively. In one embodiment, the thickness of the first electrode and the second electrode ranges from about 20 nm to about 50 nm respectively. The material of the first electrode and the second electrode is made of conductive pastes, which includes powdered metal, powdered glass with a low fusion point, and binder. The powdered metal is powdered silver. The binder is terpineol or ethyl cellulose. A weight percentage of the powdered metal is in a range from about 50% to about 90%. A weight percentage of the powdered glass with the low fusion point is in a range from about 2% to about 10%. A weight percentage of the binder is in a range from about 8% to about 40%. The first electrode and the second electrode are made by printing the conductive pastes onto part surface of the carbon nanotube layer.

The shape, size and the position of the first electrode and the second electrode are arbitrary. While applying the voltage between the first electrode and the second electrode, the bending portion of the carbon nanotube wire can produce heat to heat the phase change layer to a temperature higher than the crystallization temperature (Tc) or melting temperature of the phase change temperature (Tm).

The third electrode is spaced from the carbon nanotube layer. The third electrode is electrically connected to the first electrode and the second electrode through the phase change layer. Furthermore, the third electrode is adjacent to and spaced from the bending portion of the carbon nanotube wire. A distance between the third electrode and the bending portion ranges from about 100 nanometers to about 10 micrometers. In one embodiment, the distance ranges from about 100 nanometers to about 500 nanometers. In another embodiment, the distance ranges from about 1 micrometer to about 5 micrometers.

The shape and size of the third electrode can be selected according to need. The material of the third electrode is the same as the first electrode. In one embodiment, the material of the third electrode is conductive pastes.

Furthermore, the third electrode, the phase change layer, and the bending portion of the carbon nanotube wire can stacked with each other, the phase change layer is sandwiched between the third electrode and the bending portion of the carbon nanotube wire, and the third electrode can also be spaced from the carbon nanotube wire via the phase change layer.

In one embodiment, the carbon nanotube layer includes a plurality of carbon nanotube wires spaced from each other. The plurality of carbon nanotube wires can share the same third electrode. The plurality of bending portions of the carbon nanotube wires can be aligned along the third electrode and spaced from the third electrode. The plurality of bending portions can be distributed on the same side of the third electrode, and the plurality of bending portions can also be distributed on both two sides of the third electrode for industrialized manufacture. Furthermore, while one of the carbon nanotube wires cannot work normally, other carbon nanotubes cannot be affected. Thus the lifespan of the phase change memory cell can be prolonged.

The phase change layer is located between the third electrode and the bending portion of the carbon nanotube wire. The surface of the phase change layer is parallel with the surface of the carbon nanotube layer. The phase change layer can be partly overlapped with the bending portion of the carbon nanotube wire. Additionally, the surface of the phase change layer is parallel with the extending direction of the carbon nanotubes of the carbon nanotube wire. In one embodiment, the phase change layer completely covers the bending portion, thus the heating generated at the bending portion can be effectively utilized, and the driving voltage can be low.

The thickness of the phase change layer ranges from about 10 nm to about 200 nm. The shape of the phase change layer can be triangular, square, rectangular, round, oval or other geometric shapes. The phase change layer is located within the coverage area of the bending portion of the carbon nanotube wire. It means that the area of the phase change layer is smaller than that of the bending portion, and the entire phase change layer is located within the surface of bending portion.

The material of the phase change layer can be germanium-antimony-tellurium (Ge—Sb—Te, also referred as "GST"), germanium-tellurium, silicon-antimony-tellurium, silicon-tellurium, or chalcogenide alloys. The phase change layer functions as a variable resistor (i.e., resistance being variable with heat). The phase change material is conditioned in one of two stable states, i.e., a crystalline state or an amorphous state. The phase change material can change phase between the crystalline state and the amorphous state, based on the heat produced by the carbon nanotube layer. In one embodiment, the material of the phase change layer is GST, and the original state of the material is amorphous state with a relatively high resistance. The amorphous state will be transferred into crystalline state with a relatively low resistance over a crystallization temperature (Tc) in a range from about 200° C. to about 300° C., and the crystalline state will be transferred into amorphous state in a melting temperature (Tm) in a range from about 400° C. to about 500° C. The melting temperature is also the reset temperature of the phase change materials.

The terms "crystalline" and "amorphous" are relative terms in the context of phase change materials. That is, when a phase change memory cell is said to be in its crystalline state, one skilled in the art will understand that the phase change material of the cell has a more well-ordered crystalline structure when compared to its amorphous state. A phase change memory cell in its crystalline state need not be fully crystalline, and a phase change memory cell in its amorphous state need not be fully amorphous. The resistance of the phase change materials in its crystalline state is smaller than that in its amorphous state.

Furthermore, a conductive layer (not shown) can be located between the phase change layer and the carbon nanotube layer to transfer the heat produced by the bending portion to the phase change layer. The material of the conductive layer can be selected according to need such as the Au, Ag, Cu or other conductive materials. The phase change layer can be suspended above the bending portion of the carbon nanotube wire. The phase change layer and the bending portion can also be spaced in a certain interval. The distance of the interval can be arbitrary and the heat produced by the carbon nanotube layer can transfer the phase of the phase change layer.

The working process of the phase change memory cell includes three stages: writing data, reading data and resetting data. The original state of the phase change layer is amorphous state with high resistance and presents data "0". The amorphous state is usually referred to as a reset state. The crystalline state with low resistance presents data "1".

During the process of writing data, a voltage is applied between the first electrode and the second electrode, the carbon nanotube layer will produce heat to heat the phase change layer. While the temperature of the phase change material (GST) is heated to be higher than the Tc, the phase change material will turn to crystalline state with low resistance. Thus, the process of writing data is completed.

Furthermore, when the voltage is removed, the phase change material is settled in the crystalline state when it is slowly quenched after being heated within a temperature window that higher than the Tc and low than the Tm during a time.

During the process of reading data, a relatively small voltage is applied between the third electrode and the first electrode or the second electrode. The current flowing in the phase change layer is so small that it cannot cause the phase transition. By measuring the feedback current, the resistance of the phase change layer can be obtained. The data can be read out by comparing the obtained resistance with the original resistance of the phase change layer. If the obtained resistance is smaller than the original resistance of the phase change layer, a data "1" is obtained. If the obtained resistance is substantially equal to the original resistance, a data "0" is obtained.

During the process of resetting data, the phase change layer is rapidly quenched after being heated over its melting point by supplied current. The state of the phase change material will be transferred into the amorphous state. The amorphous state is usually referred as a reset state, storing data "0". Thus the data of the phase change memory cell is reset. The resistance in the memory cell is relatively high in the amorphous state, and relatively low in the crystalline state.

Embodiment 1

Figure 2:
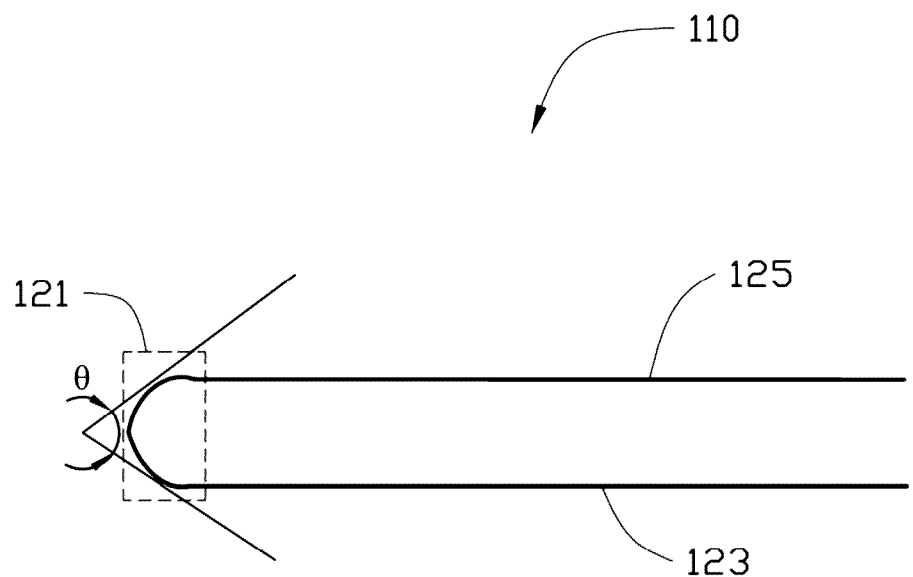
FIG. 2 shows an enlarged view of a bending portion of a carbon nanotube wire in the phase change memory cell.

Referring to FIGS. 1-2, a phase change memory cell 10 includes a substrate 110, a plurality of carbon nanotube wires 120 spaced from each other, a phase change layer 130, a first electrode 122, a second electrode 124, and a third electrode 126.

Figure 3:
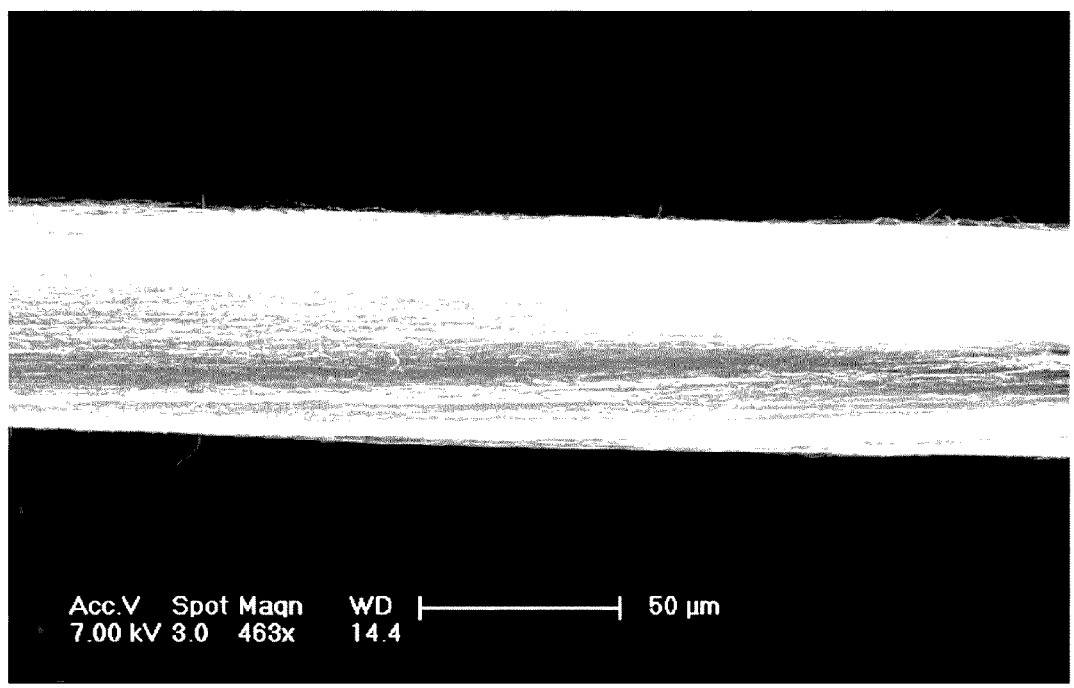
FIG. 3 shows a Scanning Electron Microscope (SEM) image of untwisted carbon nanotube wire.
Figure 4:
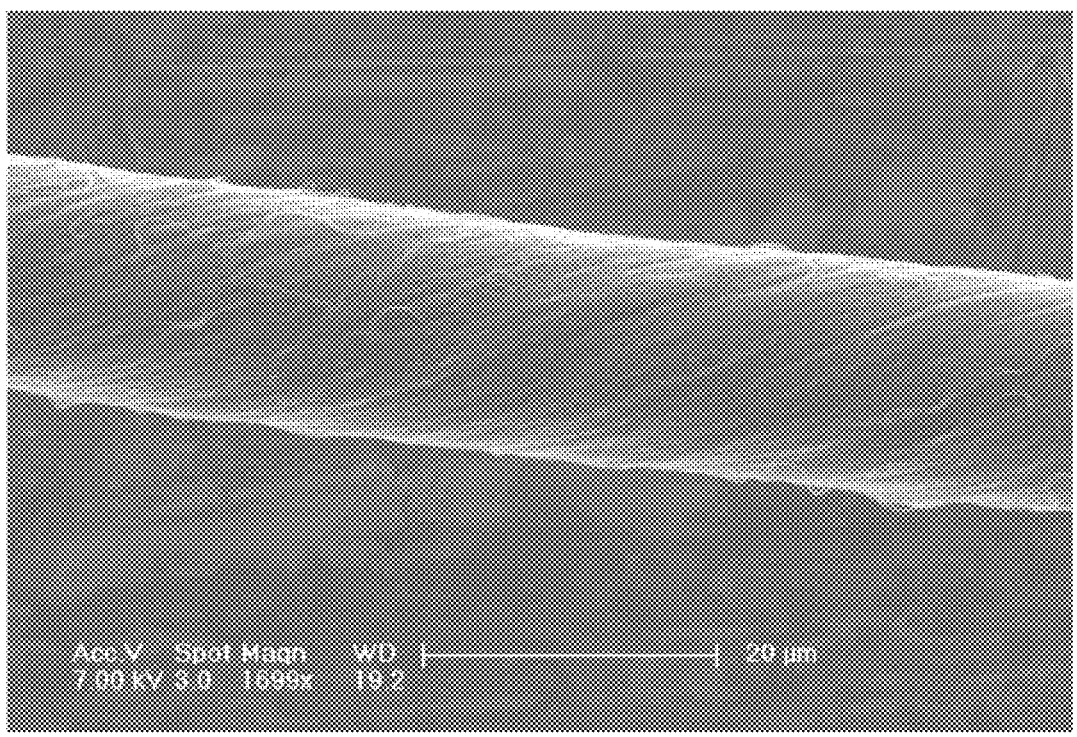
FIG. 4 shows a SEM image of twisted carbon nanotube wire.

The material of substrate 110 is polyimide having a thickness of 20 micrometers. The substrate 110 can retain its structure under 500° C. Referring to FIGS. 3-4, the plurality of carbon nanotube wires 120 are untwisted wires or twisted wires. Each of the plurality of carbon nanotube wires 120 includes a first portion 123, a bending portion 121, and a second portion 125 connected in series. The first portion 123 is parallel with and spaced from the second portion 125, and a distance between the first portion 123 and the second portion 125 is about 5 micrometers. The first electrode 122 is electrically connected to the first portion 123, and the second electrode 124 is electrically connected to the second portion 125 to write data into the phase change memory cell 10. The carbon nanotube wire 120 is folded at the bending portion 121.

The third electrode 126 can be a freestanding carbon nanotube wire with a diameter of about 10 micrometers. The distance between the third electrode 126 and bending portion 121 is about 5 micrometers. The phase change layer 130 is located between the third electrode 126 and the bending portion 121. The phase change layer 130 is electrically connected to the third electrode 126 and covers the bending portion 121 of the carbon nanotube wire 120.

The material of the phase change layer 130 is GST. The initial state of the phase change layer 130 is amorphous phase with high resistance. The phase change layer 130 will be change to crystalline phase with low resistance at the temperature from about 200° C. to about 300° C. The crystalline phase of the phase change layer 130 will be reset into amorphous state at the temperature from about 400° C. to about 500° C.

A current can be introduced into the phase change layer 130 via the first electrode 122 and the second electrode 124 to change the phase state of the phase change layer 130. A voltage can be applied between the third electrode 126 and the first electrode 122 or the second electrode 124 to detect the resistance of the phase change layer 130 to detect the phase state.

Embodiment 2

Figure 5:
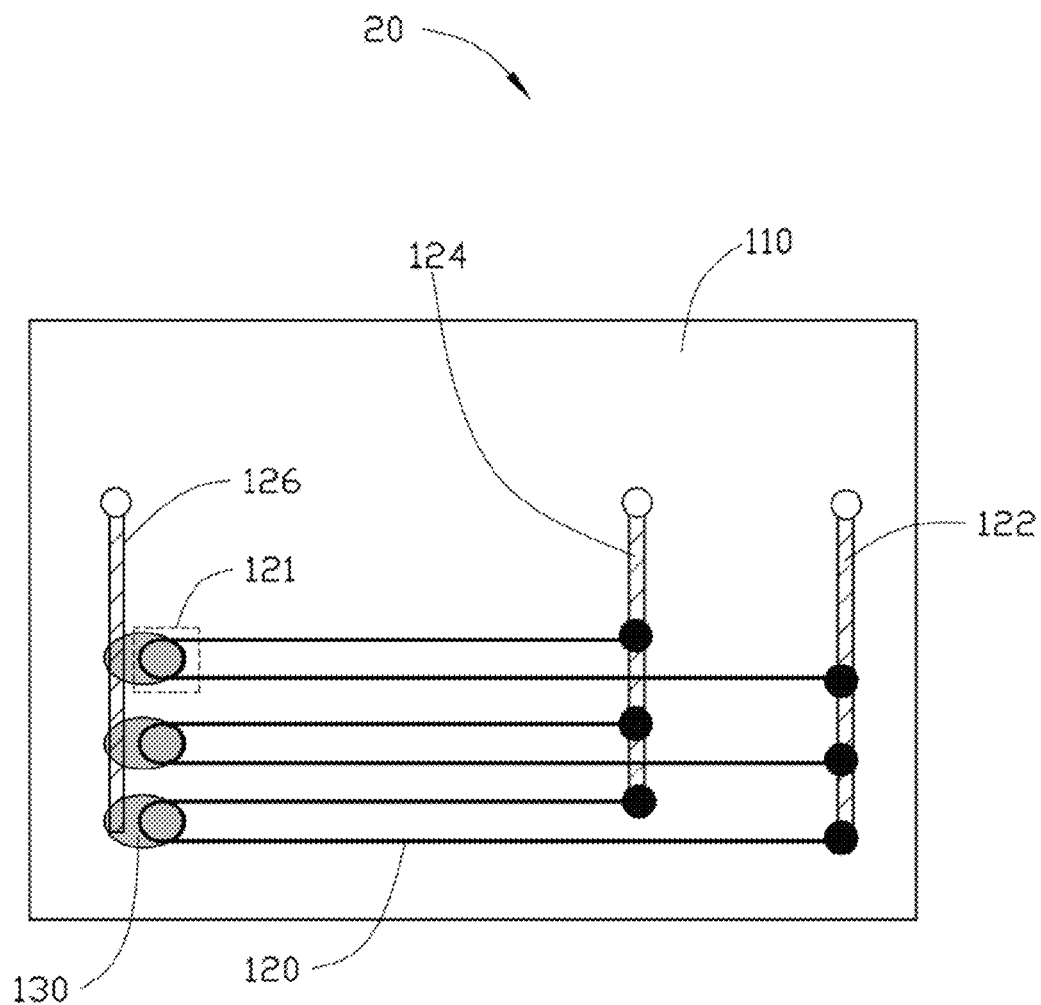
FIG. 5 is a schematic top view of another embodiment of a phase change memory cell.
Figure 6:
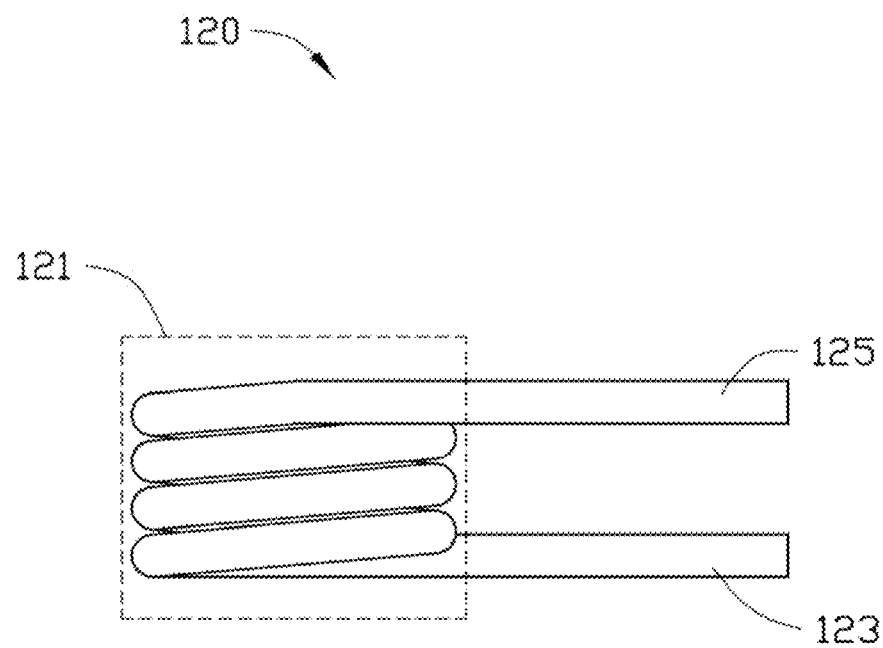
FIG. 6 shows an enlarged view of a bending portion of a carbon nanotube wire in the phase change memory cell of FIG. 6.

Referring to FIGS. 5-6, a phase change memory cell 20 includes a substrate 110, a plurality of carbon nanotube wires 120 spaced from each other, a phase change layer 130, a first electrode 122, a second electrode 124, and a third electrode 126.

The phase change memory cell 20 is similar to the phase change memory cell 10, except that the bending structure 121 of each of the plurality of carbon nanotube wires 120 forms a circular structure.

The carbon nanotube wire 120 is wound to form the circular structure at the bending portion 121. The circular structure can includes one circle or a plurality of circles overlapped together. The phase change layer 130 covers the circular structure, and electrically connects to the third electrode 126. The circular structure can further improve the heat efficiency of the carbon nanotube wires 120 at the bending portion 121. The heat can be effectively accumulated at the bending portion 121, thus the response speed of the phase change layer 130 can be improved, and the writing speed of the phase change memory cell 20 can be improved. In one embodiment, an inner diameter of the circular structure at the bending portion 121 is about 5 micrometers.

Figure 7:
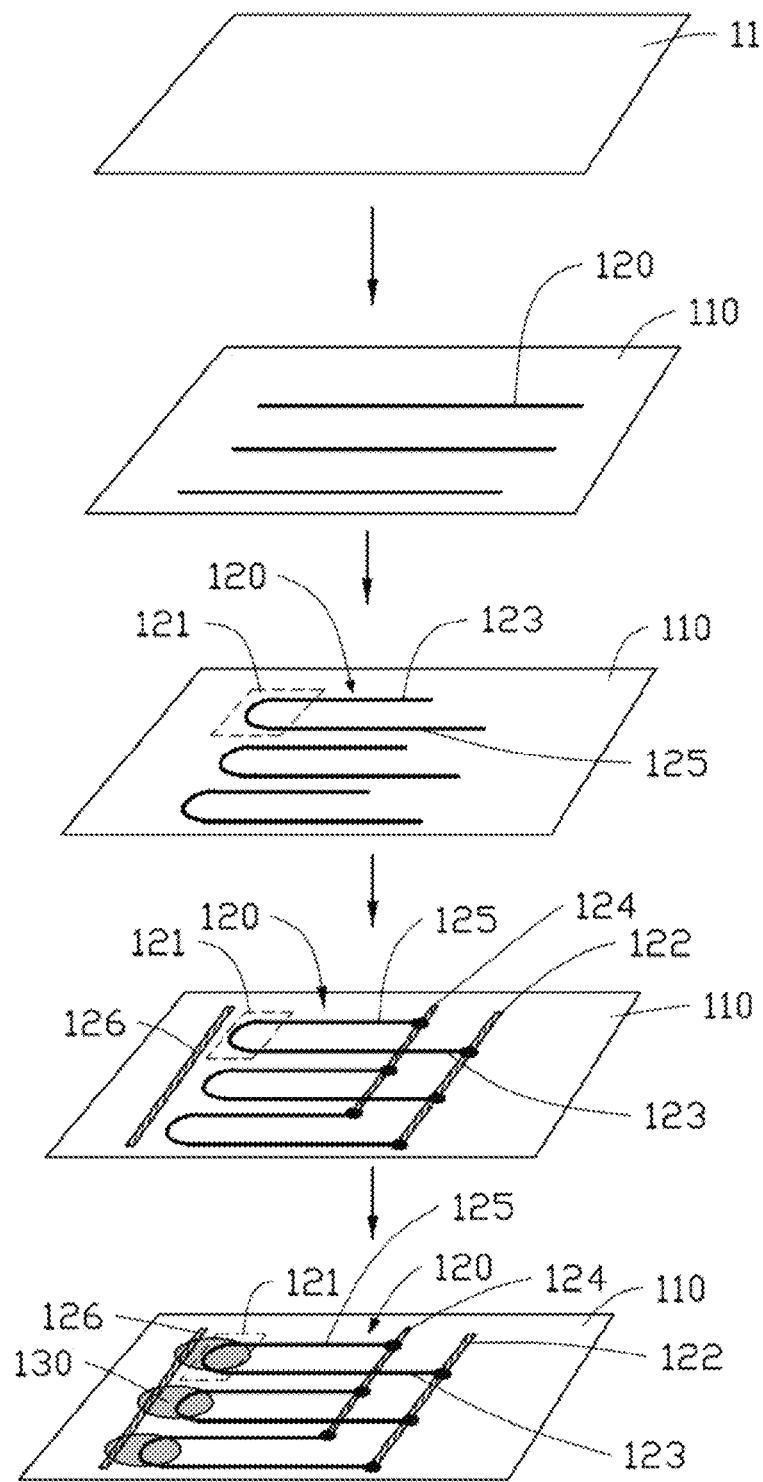
FIG. 7 shows a flow chart of one embodiment of a method for making phase change memory cell.

Referring to FIG. 7, one embodiment of a method for making the phase change memory cell 10 includes following steps:

(S11) providing a substrate 110;
(S12) locating a carbon nanotube wire 120 on a surface of the substrate 110, wherein the carbon nanotube wire 120 extends parallel with the surface of the substrate 110;
(S13) bending the carbon nanotube wire 120 to form a bending portion 121;

(S14) applying a first electrode 122, a second electrode 124, and a third electrode 126, wherein the first electrode 122 and the second electrode 124 are spaced from each other and electrically connected to the carbon nanotube wire 120, and the third electrode 126 is spaced from the bending portion 121;

(S15) depositing a phase change layer 130 to cover the bending portion 121 and electrically connect the third electrode 126.

In step (S12), the carbon nanotube wire 120 includes a first end and a second end opposite to the first end. The carbon nanotube wire 120 can extend along the surface of the substrate 110. Furthermore, the first end of the carbon nanotube wire 120 can be firstly attached and fixed on the substrate 110. The first end can be fixed on the substrate 110 by depositing an organic binder such as polymethylmethacrylate (PMMA), or Polydimethyl siloxane (PDMS). In one embodiment, the carbon nanotube wire 120 can be divided into a first half and a second half. The first half of the carbon nanotube wire 120 adjacent to the first end is fixed on the substrate 110. The fixed portion of the carbon nanotube wire 120 forms a first portion 123.

In step (S13), the second end of the carbon nanotube wire 120 can be bent via a fixing tool, such as gripping tool or bonding tool. The gripping tool can be a forceps. The second end of the carbon nanotube wire 120 can be fixed by the fixing tool and bent. Because the first half of the carbon nanotube wire 120 has been firmly attached on the substrate 110, thus the second half of the carbon nanotube wire 120 can be bent. The second half forms the second portion 125. The conjunction between the first half and the second half forms the bending portion 121. Furthermore, the carbon nanotube wire 120 can be bent backward or folded, thus the first portion 123 can be parallel with the second portion 125.

Because the carbon nanotube wire 120 has certain toughness and flexibility, the first portion 123 will be spaced from the second portion 125. The carbon nanotube wire 120 bend several times in microscale at the bending portion 121.

The second portion 125 can be attached on the surface of the substrate 110. The second portion 125 can also be bent upward from the substrate 110. Thus the second portion 125 can be stacked on the first portion 123 and insulated from the first portion 123 via the organic binder.

In step (S14), the first electrode 122, the second electrode 124, and the third electrode 126 can be formed by a method such as screen printing, ion beam deposition, electron beam deposition, chemical vapor deposition or coating. In one embodiment, the first electrode 122, the second electrode 124, and the third electrode 126 are formed by screening printing respectively. The first electrode 122 and the second electrode 124 are located on the two opposite ends of the carbon nanotube wire 120 in a certain interval. The third electrode 126 can be a carbon nanotube wire directly attached on the substrate 110.

Figure 8:
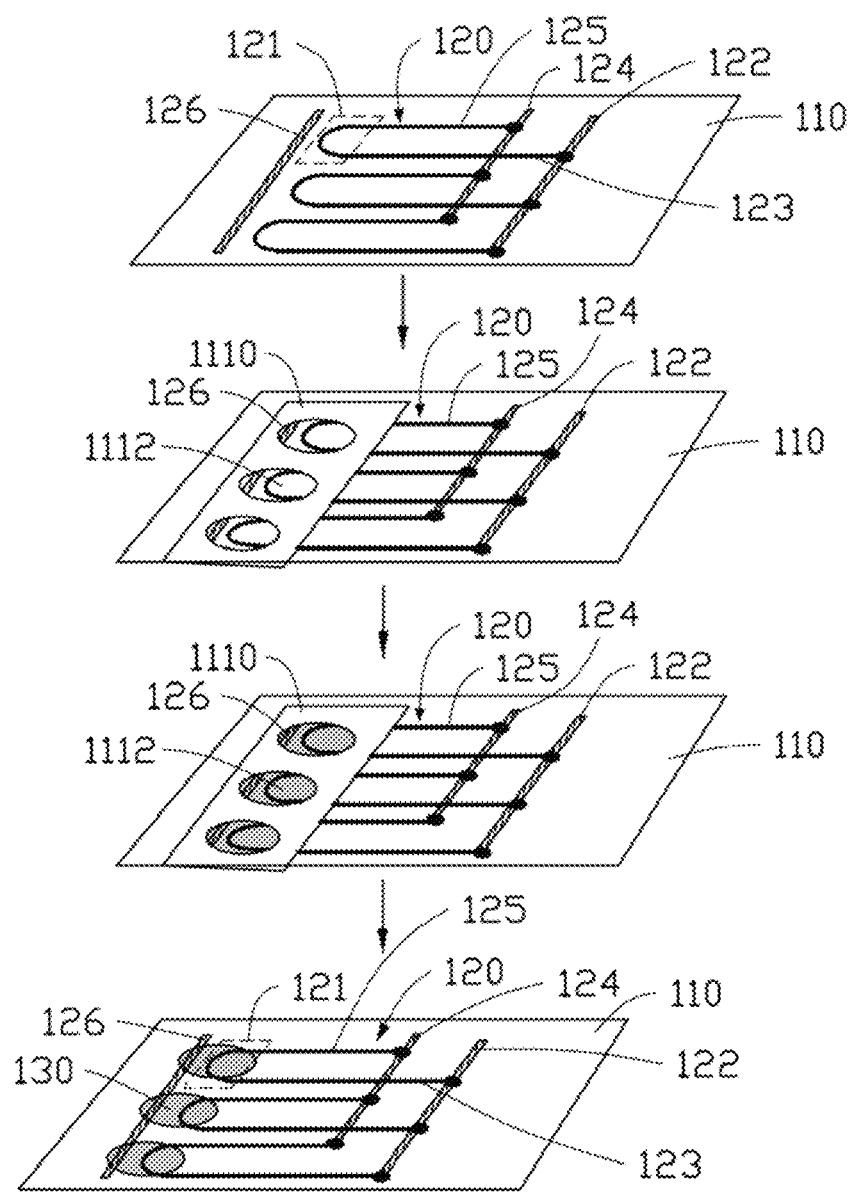
FIG. 8 shows a flow chart of one embodiment of a method for forming a phase change layer in the method of FIG. 7.

In step (S15), referring to FIG. 8, the phase change layer 130 is deposited on the bending portion 121 and electrically connected to the third electrode 126. The phase change layer 130 can be disposed via a method such as screen printing, ion beam deposition, electron beam deposition, chemical vapor deposition, or sputtering. In one embodiment, the phase change layer 130 is formed on the substrate via sputtering.

The phase change layer 130 can be electrically connected to the third electrode 126 by following steps:

(S161) providing a mask layer 1110 with a plurality of through holes 1112;

(S162) locating the mask layer 1110 on the substrate 110, wherein the third electrode 126 and the bending portion 121 are exposed through the through holes 1112;

(S163) depositing the phase change layer 130 into the plurality of through holes 1112, wherein the third electrode 126 and the bending portion 121 exposed through the through holes 1112 are covered by the phase change layer 130;

(S164) removing the mask layer 1110.

It can be understood that the carbon nanotube wire 130 can also be bent and directly attached on the substrate 110.

In the method for making the phase change memory cell, because the carbon nanotube wire is bent, thus the resistance of the carbon nanotube wire at the bending portion is dramatically increased, and the carbon nanotube wire cannot be broken down.

The heat efficiency of the bending portion is improved. The method of making phase change memory cell is simple, low in cost, and suitable for integrated production.

Figure 9:
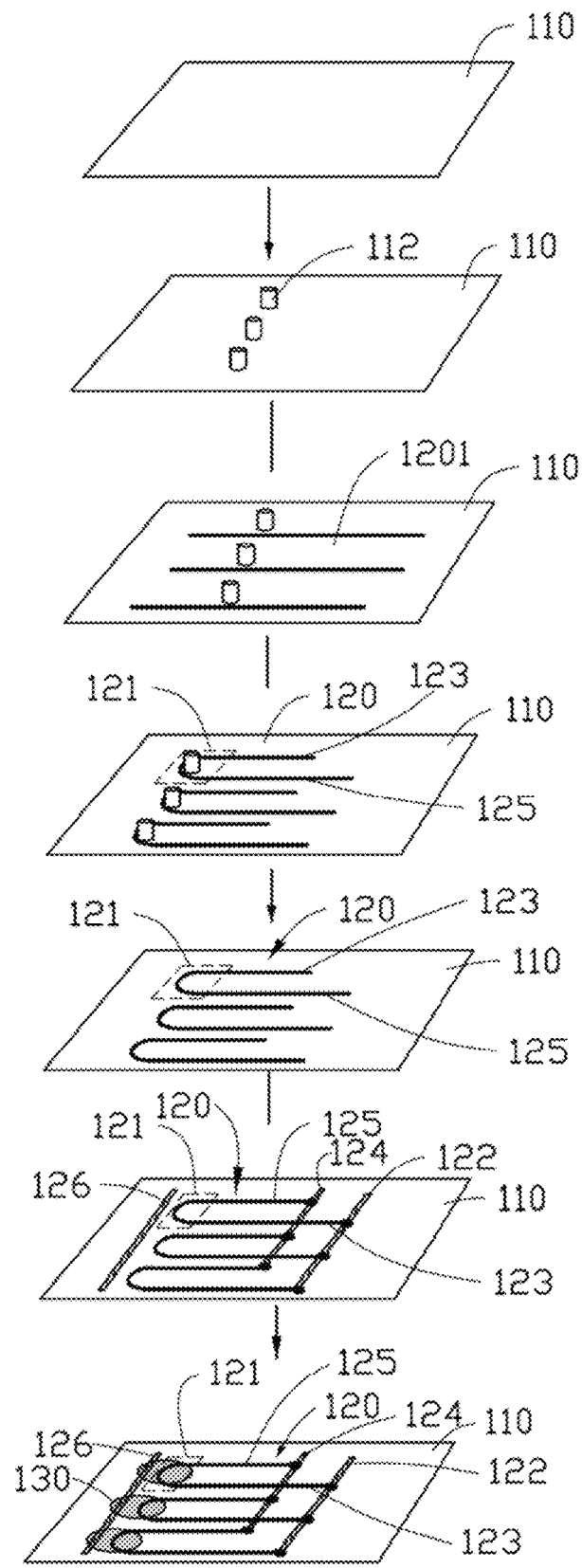
FIG. 9 shows a flow chart of one embodiment of a method for making phase change memory cell.

Referring to FIG. 9, a method of making phase change memory cell 10 of another embodiment comprising:

(S21) providing a substrate 110;

(S22) locating a plurality of sacrifice columns 112 on the substrate 110;

(S23) providing a carbon nanotube thread 1201 having a free end and fixing the free end of the carbon nanotube thread 1201 on the substrate 110;

(S24) forming a plurality of carbon nanotube wires 120 by bending the carbon nanotube thread 1201 around the plurality of sacrifice column 112 one by one and cutting the carbon nanotube thread 1201, wherein each of the plurality of carbon nanotube wire 120 includes a first end, a second end opposite to the first end, and a bending portion 121 between the first end and the second end around the sacrifice column 112;

(S25) removing the plurality of sacrifice columns 112;

(S26) applying a first electrode 122 and a second electrode 124 electrically connected to each of the plurality of carbon nanotube wire 120, and a third electrode 126 spaced from the plurality of bending portions 121; and (S27) depositing a phase change layer 130 to cover the plurality of bending portions 121 and electrically connect to the third electrode 126.

In step (S22), a material of the sacrifice column 112 can be selected according to the substrate 110, such as $SiO_2$, $Al_2O_3$. The substrate 110 and the carbon nanotube wire 120 will not be affected during removing the sacrifice column 112. In one embodiment, the sacrifice column 112 is silicon and in a shape of cylinder with a diameter about 3 micrometers. The sacrifice column 112 can be removed by HF solution.

The alignment of the plurality of sacrifice columns 112 can be selected according to need. In one embodiment, the plurality of sacrifice columns 112 are aligned along a straight line. In another embodiment, the plurality of sacrifice columns 112 are aligned along a plurality of columns and lines.

Figure 10:
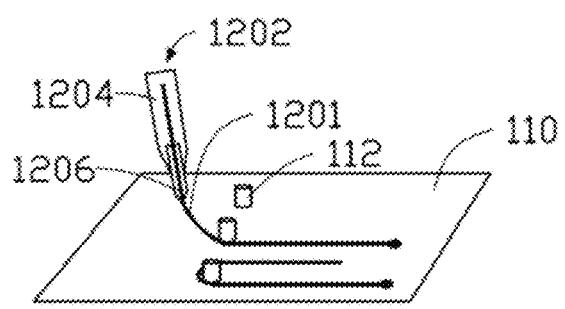
FIG. 10 shows a flow chart of one embodiment of a method of bending a carbon nanotube wires in the method of FIG. 9.

Referring to FIG. 10, in step (S23), a carbon nanotube thread supply device 1202 can be provided to continuously supply the carbon nanotube thread 1201. The carbon nanotube thread supply device 1202 includes a hollow tube 1204, and the hollow tube 1204 connects to a hollow needle 1206. The carbon nanotube thread 1201 is hided in the hollow tube 1204 and exposed through the hollow needle 1206.

In step (S24), the carbon nanotube thread 1201 can be wound around each of the plurality of sacrifice columns 112 one by one and cut. The end of the carbon nanotube thread 1201 exposed from the hollow needle 1206 can be attached on the surface of the substrate 110, and the other of the carbon nanotube thread 1201 can be drawn by the hollow needle 1206 and wound around the sacrifice column 112. After the carbon nanotube thread 1201 has been wound on the sacrifice column 112 and drawn away from the sacrifice column 112 for a certain distance, the other end of the carbon nanotube thread 1201 can be fixed on the substrate 110. Then the carbon nanotube thread 1201 can be cut to form the bending portion 121 and the carbon nanotube wire 110.

The cut position can be selected according to need to ensure that the bending portion 121 wound on the sacrifice is not damaged. The carbon nanotube thread 1201 can be cut via mechanical cutting, laser scanning, the electron beam scanning, or laser-assisted current fuse.

In step (S25), after the bending portion 121 is formed on each of the plurality of sacrifice columns 112, the sacrifice column can be removed via acidic solution or alkaline solution. During this process, the carbon nanotube wires 120 cannot be affected.

It can be understood that, the plurality of carbon nanotube wires 120 can be formed by winding a plurality of nanotube threads 1201 around the plurality of sacrifice columns 112 at the same time. Then the plurality of carbon nanotube threads 1201 can be cut, and the production efficiency can be improved.

Furthermore, the carbon nanotube thread 1201 can be wound on the sacrifice column 112 for several loops, thus the bending portion 121 can be formed into the circular structure or spiral structure.

In one embodiment, the plurality of sacrifice columns 112 are aligned to form a plurality of columns and rows, the carbon nanotube thread 1201 can be drawn forth and back between the plurality of rows and columns sacrifice columns 112. After the carbon nanotube thread 1201 is cut to form the plurality of carbon nanotube wires 120, a plurality of phase change memory cell 10 can be obtained at the same time.

Figure 11:
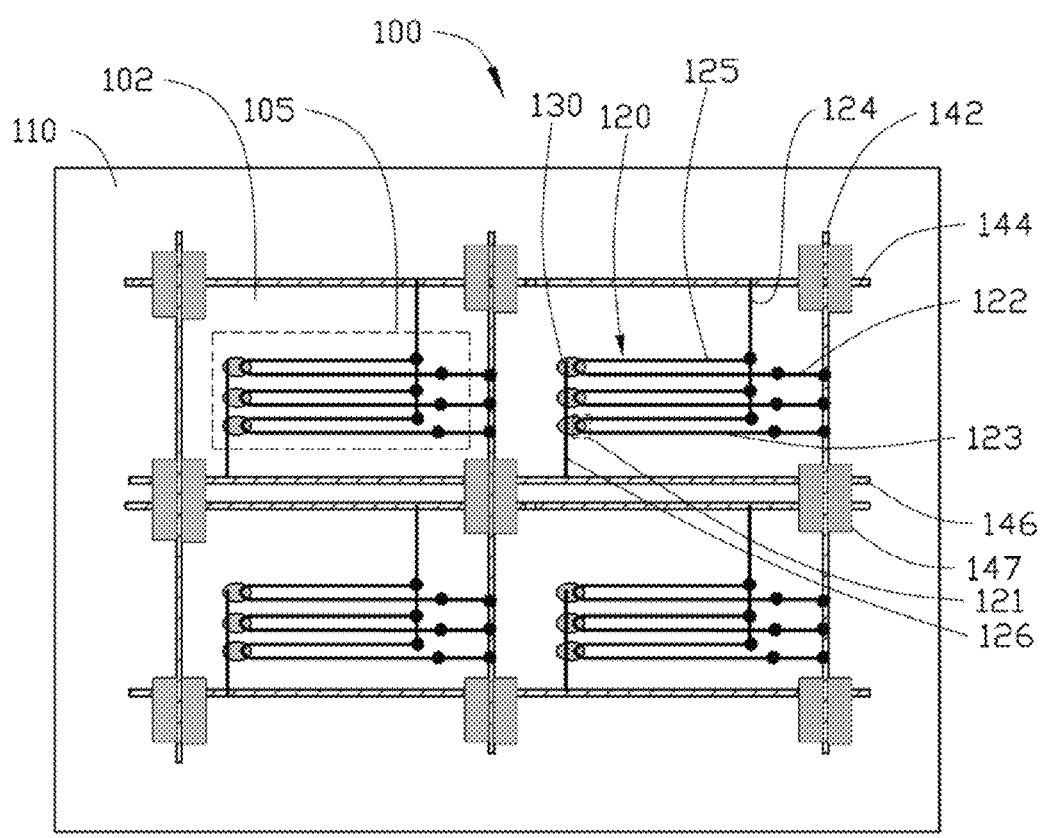
FIG. 11 shows a schematic view of another embodiment of phase change memory.

Referring to FIG. 11, one embodiment of a phase change memory 100 includes a plurality of first row electrode leads 144, a plurality of second row electrode leads 146, a plurality of column electrode leads 142, and a plurality of phase change memory units 105 located on a substrate 110.

The plurality of first row electrode leads 144 is parallel and spaced with each other. The plurality of second row electrode leads 146 is parallel and spaced with each other. The plurality of first row electrode leads 144 and the plurality of second row electrode leads 146 are located alternately in the direction which is perpendicular to the extending direction. It means that, one first row electrode lead 144 is located between two adjacent second row electrode leads 146, and one second row electrode lead 146 is located between two adjacent first row electrode leads 144. Similarly, the plurality of column electrode leads 142 are located in the direction which is perpendicular to the extending direction. The column electrode lead 142 is intersected and insulated with each of the first row electrode leads 144 and the second row electrode lead 146 to form a grid.

A section 102 is defined between the adjacent first row electrode lead 144, the second row electrode lead 146, and the two adjacent column electrode leads 142. The phase change memory unit 105 is received in one of sections 102.

Each phase change memory unit 105 includes a carbon nanotube wire 120, a phase change layer 130, and a third electrode 126 spaced from the carbon nanotube wire 120. The carbon nanotube wire 120 is electrically connected between the first row electrode lead 144 and the column electrode lead 142 to form the writing circuit into data into the phase change memory unit 105. The carbon nanotube wire 120 includes a first portion 123, a bending portion 121, and a second portion 125 connected in series. The phase change layer 130 covers the bending portion 121 of the carbon nanotube wire 120. The first portion 123 can be electrically connected to the column electrode lead 142 via a first electrode 122. The second portion 125 can be electrically connected to the first row electrode lead 144 via a second electrode 144. The third electrode 126 is electrically connected between the phase change layer 130 and the second row electrode lead 146. The third electrode 126 is spaced from the bending portion 121. The second row electrode lead 144, the third electrode 126, the phase change layer 130, the carbon nanotube wire 120, and the first row electrode lead 144 can form the reading circuit to read data from the phase change memory unit 105.

The writing circuit can also be used as the reset circuit to reset the phase change memory unit 105. While a voltage is supplied between the first row electrode lead 144 and the column electrode lead 142, the current can flow through the first row electrode lead 144, the carbon nanotube wire 120, and the first column electrode 142. While a voltage is supplied between the second row electrode lead 146 and the column electrode lead 142, the current can flow through the second row electrode lead 146, the phase change layer 130, the carbon nanotube wire 120, and the column electrode lead 142. The reading circuit can also be used as the reset circuit to reset the phase change memory unit 105.

Each phase change memory unit 105 is received into one section 102. The structure of the phase change memory unit 105 can be similar to the structure of the phase change memory cell 10 or the phase change memory cell 20. The plurality of phase change memory units 105 can be aligned to form an array. Each of the plurality of phase change memory units 105 can be separately controlled through the plurality of first row electrode leads 144, the plurality of second row electrode leads 146, and the plurality of column electrode leads 142. Thus the phase change memory 100 can be used to storage or read large data.

The phase change memory cell and the phase change memory have following advantages. First, the carbon nanotube wire has relatively high conductivity and chemical stability, thus the life span of the phase change memory will be improved. Second, the carbon nanotube wire is functioned as the heating element, and the carbon nanotube layer is flexible, thus the phase change memory can be flexible too. Third, the carbon nanotube wire is bent, thus the heat can be effectively accumulated at the bending portion, thus the heat efficiency can be improved, the response speed can be improved, and the reading speed and the writing speed can be accelerated.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

It is to be understood that the above-described embodiments are intended to illustrate rather than limit the disclosure. Variations may be made to the embodiments without departing from the spirit of the disclosure as claimed. It is understood that any element of any one embodiment is considered to be disclosed to be incorporated with any other embodiment. The above-described embodiments illustrate the scope of the disclosure but do not restrict the scope of the disclosure.

What is claimed is:

1. A phase change memory, comprising:
   a substrate;
   a plurality of first row electrode leads and a plurality of second row electrode leads substantially parallel to each other, wherein the plurality of first row electrode leads and the plurality of second row electrode leads are located alternately on the substrate;
   a plurality of column electrode leads substantially parallel to each other and located on the substrate, wherein the plurality of column electrode leads are set an angle relative to the plurality first row electrode leads and the plurality of second tow electrode leads to define a grid having a plurality of sections;
   a plurality of phase change memory units, wherein each of the plurality of phase change memory units is received in one of the plurality of sections, and each of the plurality of phase change memory units comprises:
      a first circuit, wherein the first circuit comprises a carbon nanotube wire electrically connected between one of the plurality of first row electrode leads and one of the plurality of first column electrode leads, wherein the carbon nanotube wire comprises a bending portion, and the first circuit is adapted to write data into the phase change memory or reset the phase change memory;
      a second circuit, wherein the second circuit comprises the one of the plurality of first row electrode leads, the carbon nanotube wire, a phase change layer, and one of the plurality of second row electrode leads electrically connected in series, wherein the phase change layer is electrically connected between the bending portion of the carbon nanotube wire and the second row electrode, the phase change layer covers the bending portion, and the second circuit is adapted to read data from the phase change memory.

2. The phase change memory of claim 1, wherein the carbon nanotube wire is a continuous structure and comprises a plurality of carbon nanotubes joined end to end by van der Waals force, and an extending direction of the plurality of carbon nanotubes is parallel with an axis of the carbon nanotube wire.

3. The phase change memory of claim 2, wherein the carbon nanotube wire comprises a first portion, the bending portion, and a second portion connected in series, and the first portion is spaced from the second portion.

4. The phase change memory of claim 3, wherein the first portion is electrically connected to the one of the plurality of first column electrode leads via a first electrode, and the second portion is electrically connected to the one of the plurality of first row electrode leads via a second electrode.

5. The phase change memory of claim 2, wherein a surface of the phase change layer is parallel with the extending direction of the plurality of carbon nanotubes.

6. The phase change memory of claim 1, wherein the phase change layer is electrically connected to the one of the plurality of second row electrode leads via a third electrode, the third electrode is spaced from the bending portion, and the phase change layer covers the bending portion and electrically connected to the third electrode.

7. The phase change memory of claim 1, wherein the bending portion of the carbon nanotube wire is in a shape of curved structure or folded structure.

8. The phase change memory of claim 7, wherein a bending angle of the bending portion ranges from about 30 degrees to about 60 degrees.

9. The phase change memory of claim 1, wherein the bending portion of the carbon nanotube wire is in a shape of circular structure or a spiral structure.

10. The phase change memory of claim 9, wherein an inner diameter of the bending portion ranges from about 2 micrometers to about 10 micrometers.

11. The phase change memory of claim 1, wherein a distance between the third electrode and the bending portion of the carbon nanotube wire ranges from about 100 nanometers to about 10 micrometers.

12. The phase change memory of claim 1, wherein the carbon nanotube wire is a single carbon nanotube.

13. The phase change memory of claim 1, wherein a thickness of the phase change layer ranges from about 10 nanometers to about 200 nanometers.

14. A phase change memory, comprising:
a plurality of first row electrode leads and a plurality of second row electrode leads substantially parallel to each other, wherein the plurality of first row electrode leads and the plurality of second row electrode leads are located alternately on a substrate;
a plurality of column electrode leads substantially parallel to each other and located on the substrate, wherein the plurality of column electrode leads are set an angle relative to the plurality first row electrode leads and the plurality of second row electrode leads to define a grid having a plurality of sections;
a phase change memory unit is received in each of the plurality of sections, wherein the phase change memory unit comprises:
a carbon nanotube wire, wherein the carbon nanotube wire comprises a bending portion;
a phase change layer, wherein the phase change layer is overlapped with the bending portion of the carbon nanotube wires;
two opposite ends of the carbon nanotube wire is electrically connected to one of the plurality of first row electrode leads and one of the plurality of column electrode leads respectively to write data into the phase change memory;
the phase change layer is electrically connected to one of the plurality of second row electrode leads to read data from the phase change memory.

15. The phase change memory of claim 14, wherein the bending portion of the carbon nanotube wire is in a shape of spiral structure, and the phase change layer covers the spiral structure.

16. The phase change memory of claim 14, wherein the one of the plurality of first column electrode leads, the carbon nanotube wire, and the one of the plurality of first row electrode leads are electrically connected in series to form a writing circuit to write data.

17. The phase change memory of claim 14, wherein the one of the plurality of first row electrode leads, the carbon nanotube wire, the phase change layer, and the one of the plurality of second row electrode leads are electrically connected in series to form a reading circuit to read data, and the phase change layer is spaced from the one of the plurality of second row electrode leads.

* * * * *